United States Patent
Seddon et al.

(12)

(10) Patent No.: US 11,676,863 B2
(45) Date of Patent: Jun. 13, 2023

(54) STRUCTURES FOR ALIGNING A SEMICONDUCTOR WAFER FOR SINGULATION

(71) Applicant: SEMICONDUCTOR COMPONENTS INDUSTRIES, LLC, Phoenix, AZ (US)

(72) Inventors: Michael J. Seddon, Gilbert, AZ (US); Takashi Noma, Ota (JP)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 17/651,610

(22) Filed: Feb. 18, 2022

(65) Prior Publication Data

US 2022/0172994 A1 Jun. 2, 2022

Related U.S. Application Data

(63) Continuation of application No. 17/068,129, filed on Oct. 12, 2020, now Pat. No. 11,289,381, which is a continuation of application No. 16/506,004, filed on Jul. 9, 2019, now Pat. No. 10,825,731.

(60) Provisional application No. 62/796,687, filed on Jan. 25, 2019.

(51) Int. Cl.
| | |
|---|---|
| *H01L 21/78* | (2006.01) |
| *H01L 21/66* | (2006.01) |
| *H01L 21/3205* | (2006.01) |
| *H01L 21/683* | (2006.01) |
| *H01L 21/02* | (2006.01) |
| *H01L 21/304* | (2006.01) |

(52) U.S. Cl.
CPC ........ *H01L 21/78* (2013.01); *H01L 21/02057* (2013.01); *H01L 21/304* (2013.01); *H01L 21/32051* (2013.01); *H01L 21/6836* (2013.01); *H01L 22/10* (2013.01)

(58) Field of Classification Search
None
See application file for complete search history.

(56) References Cited

U.S. PATENT DOCUMENTS

| | | | |
|---|---|---|---|
| 8,084,335 B2 | 12/2011 | Seddon et al. | |
| 8,716,067 B2 | 5/2014 | Wisotzki et al. | |
| 9,589,880 B2 * | 3/2017 | Yeduru | H01L 21/6835 |
| 10,395,967 B2 * | 8/2019 | Yoshihara | H01L 21/6836 |
| 10,825,731 B2 | 11/2020 | Seddon et al. | |

(Continued)

*Primary Examiner* — J. E. Schoenholtz
(74) *Attorney, Agent, or Firm* — Adam R, Stephenson, Ltd.

(57) ABSTRACT

Implementations of a method for aligning a semiconductor wafer for singulation may include: providing a semiconductor wafer having a first side and a second side. The first side of the wafer may include a plurality of die and the plurality of die may be separated by streets. The semiconductor wafer may include an edge ring around a perimeter of the wafer on the second side of the wafer. The wafer may also include a metal layer on the second side of the wafer. The metal layer may substantially cover the edge ring. The method may include grinding the edge ring to create an edge exclusion area and aligning the semiconductor wafer with a saw using a camera positioned in the edge exclusion area on the second side of the wafer. Aligning the wafer may include using three or more alignment features included in the edge exclusion area.

20 Claims, 2 Drawing Sheets

(56) References Cited

U.S. PATENT DOCUMENTS

2008/0242052 A1* 10/2008 Feng .................. H01L 21/3043
                                                    438/459
2009/0181519 A1   7/2009 Arai et al.
2010/0009519 A1   1/2010 Seddon et al.
2018/0301366 A1* 10/2018 Yanagida ............ H01L 21/3043

* cited by examiner

STRUCTURES FOR ALIGNING A SEMICONDUCTOR WAFER FOR SINGULATION

CROSS REFERENCE TO RELATED APPLICATIONS

This application is a continuation application of the earlier U.S. Utility Patent Application to Seddon, et al. entitled "Methods of Aligning a Semiconductor Wafer for Singulation," application Ser. No. 17/068,129, filed Oct. 12, 2020, now pending, which application is a continuation application of the earlier U.S. Utility Patent Application to Seddon, et al. entitled "Methods of Aligning a Semiconductor Wafer for Singulation," application Ser. No. 16/506,004, filed Jul. 9, 2019, now issued as U.S. Pat. No. 10,825,731, which application claimed the benefit of the filing date of U.S. Provisional Patent Application 62/796,687, entitled "METHODS OF ALIGNING A SEMICONDUCTOR WAFER FOR SINGULATION" to Seddon et al., which was filed on Jan. 25, 2019, the disclosures of each of which are hereby incorporated entirely herein by reference.

BACKGROUND

1. Technical Field

Aspects of this document relate generally to systems and methods used for aligning substrates for singulation. More specific implementations involve semiconductor substrates.

2. Background

Semiconductor substrates are used to form a wide variety of semiconductor devices. The semiconductor devices are generally distributed across a planar surface of the semiconductor substrate in a plurality of die. The plurality of die are separated from one another using a singulation process like sawing.

SUMMARY

Implementations of a method for aligning a semiconductor wafer for singulation may include: providing a semiconductor wafer having a first side and a second side. The first side of the wafer may include a plurality of die and the plurality of die may be separated by streets. The semiconductor wafer may include an edge ring around a perimeter of the wafer on the second side of the wafer. The wafer may also include a metal layer on the second side of the wafer. The metal layer may substantially cover the edge ring. The method may include grinding the edge ring to create an edge exclusion area and aligning the semiconductor wafer with a saw using a camera positioned in the edge exclusion area on the second side of the wafer. Aligning the wafer may include using two or more alignment features included in the edge exclusion area.

Implementations of methods for aligning a semiconductor wafer may include one, all, or any of the following:

The metal layer may include copper having a thickness of 15 microns.

The method may further include singulating the plurality of semiconductor die using one of sawing, lasering, or plasma etching.

The method may further include mounting the wafer to a picking tape.

Grinding the edge ring may further include washing debris from the wafer.

The metal layer may include one of gold, copper, nickel, or any combination thereof.

The camera may be an infrared camera and the semiconductor wafer may include silicon.

Implementations of a method for aligning a semiconductor wafer for singulation may include: providing a semiconductor wafer having a first side and a second side. The semiconductor wafer may include an edge ring around a perimeter of the wafer on the second side of the wafer. The method may include applying a metal coating to the second side of the wafer. The metal coating may extend substantially over the edge ring. The method may further include creating an edge exclusion area through removal of the edge ring. The method may also include aligning the wafer for singulation using an infrared camera. The infrared camera may use two or more alignment features in the edge exclusion area.

Implementations of methods for aligning a semiconductor wafer may include one, all, or any of the following:

The metal coating may be applied through one of sputtering, evaporation, or plating.

The method may further include mounting the wafer to a film frame.

The method may further include singulating a plurality of semiconductor die from the semiconductor wafer using one of sawing, lasering, and plasma etching.

The metal coating may have a thickness of at least 15 microns.

Removal of the edge ring may include grinding and washing the semiconductor wafer.

Singulating may include one of sawing, lasering, and plasma etching.

Implementations of a method for aligning a semiconductor wafer for singulation may include: mounting a first side of a semiconductor wafer to a backgrinding tape. The semiconductor wafer may include an edge ring around a perimeter of the wafer on a second side of the wafer. The method may also include applying a metal layer to the second side of the wafer. The metal layer may extend substantially over the edge ring. The metal layer may include grinding the edge ring and removing the metal layer in a perimeter area of the wafer. The method may include aligning the wafer for singulation using a camera and two or more alignment features in the perimeter area of the wafer.

Implementations of methods for aligning a semiconductor wafer may include one, all, or any of the following:

The metal layer may be applied through one of sputtering, evaporation, and plating.

The method may further include singulating a plurality of semiconductor die from the semiconductor wafer using a laser.

The metal layer may include copper having a thickness of 15 microns.

The removing the ring through grinding may further include washing debris from the wafer.

The camera may be an infrared camera and the semiconductor wafer may be silicon.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended methods of aligning a semiconductor wafer for singulation will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such methods of aligning a semiconductor wafer for singulation, and implementing components and methods, consistent with the intended operation and methods.

For semiconductor die that are less than 50 microns in thickness, particular processing challenges exist. Die handling, die strength, and performing processing operations with the die all present specific challenges, as die and wafer breakage can significantly reduce yield and/or affect device reliability. Die strength is negatively affected by traditional singulation options like sawing which induce die chipping and cracking along the die streets. These chips and cracks formed during the sawing process can eventually propagate during operation and reliability testing causing the die to fail.

Figure 1:
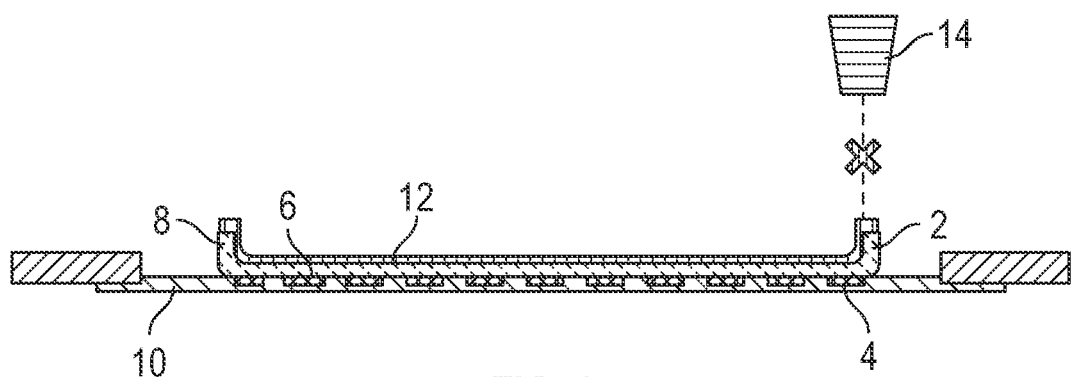
FIG. 1 is a side view of an implementation of a system for aligning a semiconductor wafer with a metal layer substantially covering an edge ring.

Referring to FIG. 1, a cross sectional side view of a substrate 2 coupled to a plurality of layers is illustrated. The term "substrate" refers to a semiconductor substrate as a semiconductor substrate is a common type of substrate, however, "substrate" is not an exclusive term that is used to refer to all semiconductor substrate types. Similarly, the term "substrate," may refer to a wafer as a wafer is a common type of substrate, however, "substrate" is not an exclusive term that is used to refer to all wafers. The various semiconductor substrate types disclosed in this document that may be utilized in various implementations may be, by non-limiting example, round, rounded, square, rectangular, or any other closed shape. In various implementations, the substrate 2 may include a substrate material such as, by non-limiting example, single crystal silicon, silicon dioxide, glass, gallium arsenide, sapphire, ruby, silicon on insulator, silicon carbide, polycrystalline or amorphous forms of any of the foregoing, and any other substrate material useful for constructing semiconductor devices. In particular implementations, the substrate may be a silicon-on-insulator substrate.

Figure 3:
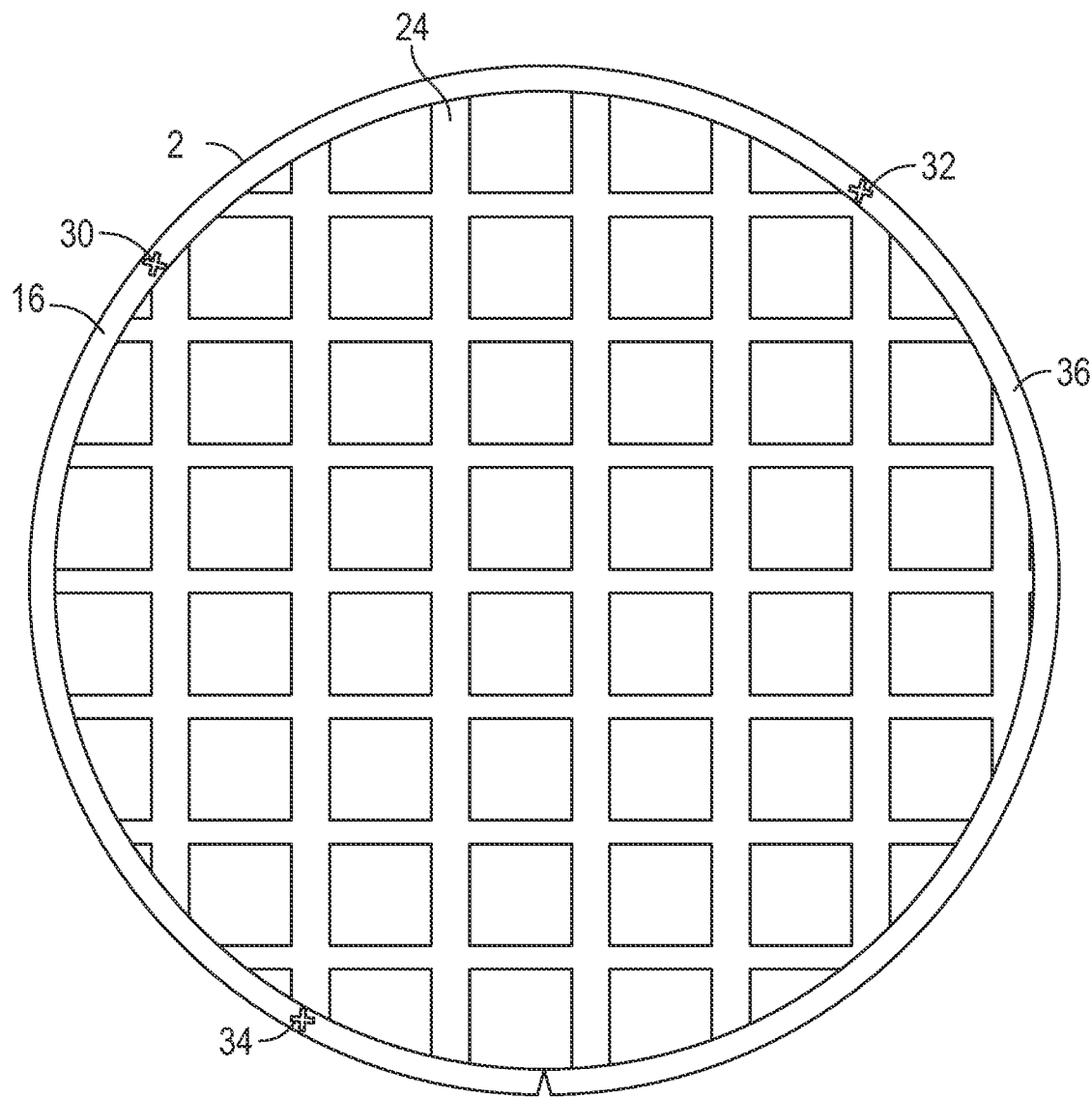
FIG. 3 is a front side view of an implementation of a semiconductor substrate/wafer.

Referring to FIGS. 1 and 3, in various implementations disclosed in this document, the semiconductor substrate 2 includes a plurality of semiconductor die 4 that have been processed using a semiconductor fabrication process to form one or more semiconductor devices therein or thereon (not shown). The die 4 may include multiple layers of metal such as, by non-limiting example, copper and aluminum. Each of the plurality of die may be separated by streets. The plurality of layers may be patterned, and in various implementations, may be patterned (or otherwise removed) to not be over a die street 24 in the substrate 2. The plurality of layers may include, by non-limiting example, one or more metal layers, one or more passivation layers, any other layer, and any combination thereof. In various implementations, the plurality of die may include power semiconductor devices, such as, by non-limiting example, a metal oxide field effect transistor (MOSFET), an insulated gate bipolar transistor (IGBT), or any other power semiconductor device. In other implementations, the plurality of die may include non-power semiconductor devices.

Following the completion of the fabrication process (or during some portion of it, in some implementations), the semiconductor substrate 2 is thinned on a side 6 of the semiconductor substrate 2 that is opposite the side on which the one or more semiconductor devices 4 have been formed to a desired substrate thickness. The thinning process takes place using backgrinding, lapping, etching, any combination thereof, or any other technique for removing the material of the semiconductor substrate 2 substantially uniformly across the largest planar surface of the substrate.

In various implementations, the thinning process may create an edge ring 8 around the wafer (like that present in the backgrinding process marketed under the tradename TAIKO by Disco Hi-Tec America, Inc. of Santa Clara, Calif.). The edge ring acts to structurally support the wafer following thinning so that no wafer carrier may need to be utilized during subsequent processing steps. In various implementations, the thinning process may be carried out after the semiconductor substrate 2 has been mounted to a backgrinding tape 10. A wide variety of backgrinding tapes may be employed in various implementations, including those that are compatible with subsequent etching operations.

Following the thinning process, the various die 4 formed in the semiconductor substrate 2 need to be singulated from one another so they can be subsequently packaged into semiconductor packages. In various implementations, following the thinning process, a back metal layer 12 is applied to the semiconductor die through, by non-limiting example, sputtering, evaporation, or another metal deposition process or combination of processes. In various implementations, the deposition process is conducted while the wafer is either supported by an edge ring or supported by the backgrinding tape. In other implementations, however, the substrate may be demounted from the backgrinding tape and mounted to another support tape for subsequent processing steps. Singulation is performed by cutting/slicing the semiconductor substrate in the die streets between each of the plurality of die using any of the various method disclosed in this document.

The total thickness of the semiconductor substrate 2 is the additive product of the thickness of the substrate material, the thickness of any die 4 thereon, the thickness of the back metal 12, and the thickness of any passivation material thereon. In various implementations, thickness of the back metal may vary from between about 1 micron ($\mu$m) to about 15 $\mu$m. In particular implementations, the thickness of the back metal may be between about 1 $\mu$m to about 3 $\mu$m. In various implementations, the total thickness of the semiconductor substrate 2 may be less than about 50 $\mu$m. In particular implementations, the total thickness of the semiconductor substrate may be between about 25 $\mu$m to about 35 $\mu$m. In various implementations, the total thickness may be about 25 $\mu$m.

In various implementations, the substrate 2 may be thinned to a thickness less than 50 µm. In other implementations, the substrate 2 may be thinned to a thickness less than 30 µm. In still other implementations, the substrate 2 may be thinned to a thickness less than 100 µm, more than 100 µm, and in other various implementations, the substrate 2 may not be thinned. In particular implementations, the substrate 2 may be thinned to a thickness of about 25 µm, and in other particular implementations, the substrate may be thinned to a thickness of about 75 µm.

To singulate the plurality of die from the substrate, the substrate must be aligned with a set of predefined physical locations where a saw or other tool used for singulating the die will be cutting into the material of the substrate. In various implementations, a plurality of alignment features may be manufactured into the substrate to guide the singulation process. The alignment features may be formed in die streets positioned between the die and formed on the first side of the substrate. In other implementations, the alignment features may be formed on edges of the die. The alignment features may be located in any layer of the substrate. In various implementations, the alignment features may be located using an infrared camera. The infrared camera may be able to penetrate through layers of silicon or other materials to locate the alignment features. In other implementations, the alignment features may be located on an outer surface of the substrate. In some implementations, the alignment features may be visible with a visible light camera.

In various implementations, following the thinning process a back metal layer 12 is applied to the semiconductor die through, by non-limiting example, sputtering, evaporation, or another metal deposition process. In particular implementations, the backside metal layer 12 may be copper or a copper alloy. In other implementations, the backside metal layer may include any other type of metal, alloy thereof, or combination thereof. In various implementations, the backside metal layer may be about 10 µm thick. In other implementations, the backside metal layer may be more or less thick than 10 µm. The backside metal layer 12 may be evaporated onto the substrate 2, however, in other implementations (including implementations having thicker substrates), the backside metal layer 12 may be plated onto the substrate 2 or formed on the substrate using another technique.

Referring again to FIGS. 1 and 3, a semiconductor wafer 2 mounted on a backgrinding tape 10 is illustrated. The tape 10 may be supported by a film frame. A method of aligning a semiconductor wafer for singulation may include providing a semiconductor wafer 2 as illustrated. The semiconductor wafer 2 includes a plurality of die 4 formed on a first side of the wafer. The semiconductor wafer 2 has been thinned leaving an edge ring 8 around a perimeter 36 of the wafer 2. In various implementations, the wafer may be thinned as previously described through backgrinding. The method may include applying a metal coating 12 to a second side of the wafer. The metal coating may include, by non-limiting example, copper, nickel, gold, any combination thereof, alloys thereof, or other metals used in the metallization process. In one particular implementation of the method, the metal layer may include copper having a thickness of about 15 microns. In other implementations, the metal layer may have a thickness that is less than 15 microns. The method may include applying the metal coating through one of sputtering, plating, evaporation, or other methods used in applying a back metal to a semiconductor wafer. The metal coating 12 may extend substantially over the edge ring 8. When the metal coating 12 substantially covers the edge ring, a camera 14 focused on a second side of the wafer 2 is prevented from viewing the metal coating. By non-limiting example, the metal layer may be covered by a patterned blanket of photoresist.

Figure 2:
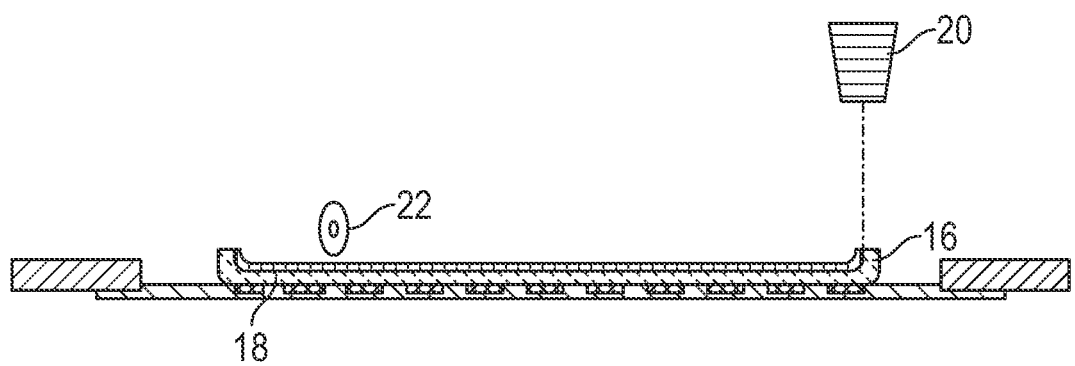
FIG. 2 is a side view of an implementation of a system for aligning a semiconductor wafer with an implementation of an edge exclusion area formed via grinding.

Referring to FIGS. 2 and 3, the substrate 2 is illustrated prepared for aligning the wafer by creating an edge exclusion area 16 located around/adjacent the perimeter 36 of the substrate 2 by removing the edge ring. The edge ring may be removed through grinding the metal layer and the material of the edge ring. Grinding the ring may also include washing debris from the wafer. Various implementations of the method may be used with substrates having thick back metal as well as thin back metal. In various implementations, a plurality of alignment features 30, 32, 34 may be included in the dimensions of edge exclusion area 16. In other implementations, at least two alignment features may be formed in the edge exclusion area. In other implementations, as illustrated in FIG. 3, three or more alignment features may be formed in the edge exclusion area. The method may further include aligning the wafer/substrate 2 for singulation using a camera 20 using at least two alignment features. In various implementations, the camera 20 may be an infrared camera and the wafer may be formed of silicon. The camera may be able to detect the alignment features in/through the silicon or other layered materials to align the wafer with a singulating tool. In various implementations, a vacuum check may not be needed in the alignment process.

In various implementations, referring to FIG. 2, the wafer may be singulated using a saw 22. In other implementations, the wafer may be singulated through lasering. Jet ablation may be used to singulate the wafer into a plurality of die in some implementations. In methods including grooving or thinning of the metal layer, plasma may be used to singulate the wafer into a plurality of die. In some implementations, a singulation step may be performed from a first side of the substrate or the second side of the substrate. For implementations where sawing or lasering is used for singulation, remote plasma healing may be performed on the singulated dies to remove sidewall damage. In various implementations, remote plasma healing may also be used to remove small amount of re-deposition.

Variations of this method may allow for active modifications/adjustments to the alignment of the wafer or the singulation process itself during the singulation process based on visual inspection. Non-limiting examples of possible modifications may include changes in laser power, changes in pulse of the laser, or changes in speed. The camera 20 may also be able to monitor the need to clear back metal/remaining back metal thickness. In various implementations, the camera may be used to measure any thickness variations of any ablated metal and the original thickness of the metal. Such monitoring may allow the adjustment of singulating parameters during the singulation process. In various implementations, the use of the alignment features in the edge exclusion area during the alignment process may not require to use of a vacuum check.

In places where the description above refers to particular implementations of method for wafer/substrate alignment and implementing components, sub-components, methods and sub-methods, it should be readily apparent that a number of modifications may be made without departing from the spirit thereof and that these implementations, implementing components, sub-components, methods and sub-methods may be applied to other methods for wafer alignment.

What is claimed is:

1. A semiconductor wafer comprising:
a first side and a second side, the first side of the semiconductor wafer comprising a plurality of die;
an edge ring around a perimeter of the semiconductor wafer on the second side of the semiconductor wafer; and
a metal layer coupled over the second side of the semiconductor wafer;
wherein the edge ring comprises two or more alignment features configured to align the semiconductor wafer for singulation.

2. The semiconductor wafer of claim 1, wherein the metal layer comprises copper having a thickness of 15 microns.

3. The semiconductor wafer of claim 1, wherein a surface of the edge ring facing away from the first side of the semiconductor wafer is coplanar with a portion of a surface of the metal layer facing away from the first side of the semiconductor wafer.

4. The semiconductor wafer of claim 1, wherein the metal layer comprises one of gold, copper, nickel, or any combination thereof.

5. The semiconductor wafer of claim 1, wherein the two or more alignment features are on an outer surface of the edge ring.

6. The semiconductor wafer of claim 1, wherein the two or more alignment features are embedded within and covered by the edge ring.

7. The semiconductor wafer of claim 1, wherein the edge ring comprises an edge exclusion area.

8. A semiconductor wafer comprising:
a first side and a second side, the first side of the semiconductor wafer comprising a plurality of die;
an edge ring around a perimeter of the semiconductor wafer on the second side of the semiconductor wafer; and
a metal layer coupled to the second side of the semiconductor wafer and extending over the edge ring;
wherein the edge ring comprises two or more alignment features configured to align the semiconductor wafer for singulation.

9. The semiconductor wafer of claim 8, wherein the metal layer comprises copper having a thickness of 15 microns.

10. The semiconductor wafer of claim 8, wherein the metal layer comprises one of gold, copper, nickel, or any combination thereof.

11. The semiconductor wafer of claim 8, wherein the two or more alignment features are embedded within and covered by the edge ring.

12. A semiconductor wafer comprising:
a first side and a second side, the first side of the semiconductor wafer comprising a plurality of die separated by die streets;
an edge ring formed around a perimeter of the semiconductor wafer on the second side of the semiconductor wafer; and
a metal layer coupled to the second side of the semiconductor wafer and coupled within an area circumscribed by the edge ring;
wherein the edge ring comprises two or more alignment features configured to align the semiconductor wafer for singulation.

13. The semiconductor wafer of claim 12, wherein the metal layer comprises copper having a thickness of 15 microns.

14. The semiconductor wafer of claim 12, wherein a surface of the edge ring facing away from the first side of the semiconductor wafer is coplanar with a portion of a surface of the metal layer facing away from the first side of the semiconductor wafer.

15. The semiconductor wafer of claim 12, wherein the metal layer comprises one of gold, copper, nickel, or any combination thereof.

16. The semiconductor wafer of claim 12, wherein the two or more alignment features are on an outer surface of the edge ring.

17. The semiconductor wafer of claim 12, wherein the two or more alignment features are embedded within and covered by the edge ring.

18. The semiconductor wafer of claim 12, wherein the edge ring comprises an edge exclusion area.

19. The semiconductor wafer of claim 12, wherein the edge ring comprises a height equal to a height of the metal layer.

20. The semiconductor wafer of claim 12, wherein the semiconductor wafer is configured to be aligned using an infrared camera.

* * * * *